(12) United States Patent
Ryskoski (10) Patent No.: US 6,582,975 B1
(45) Date of Patent: Jun. 24, 2003

(54) METHOD OF CONTROLLING THE DEPOSITION OF INTER-LEVEL DIELECTRIC LAYERS BASED UPON ELECTRICAL PERFORMANCE TESTS, AND SYSTEM FOR ACCOMPLISHING SAME

(75) Inventor: Matthew Ryskoski, Kyle, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/925,964

(22) Filed: Aug. 9, 2001

(51) Int. Cl.[7] .......................... H01L 21/00; B05C 11/00
(52) U.S. Cl. .................................. 438/10; 118/665
(58) Field of Search ........................ 118/665, 695, 118/712; 438/5, 6, 10, 11, 12, 14, 17, 18

(56) References Cited

U.S. PATENT DOCUMENTS 5,665,199 A * 9/1997 Sahota et al. ................. 438/14

OTHER PUBLICATIONS

M. B. Anand et al., "Optimization Study of VLSI Interconnect Parameters", Jan. 2000, IEEE transactions on Electron Devices, vol. 47, No. 1, pp. 178–186.*

* cited by examiner

Primary Examiner—Evan Pert
(74) Attorney, Agent, or Firm—Williams, Morgan & Amerson, P.C.

(57) ABSTRACT

In one illustrative embodiment, the method comprises performing at least one electrical performance test on an integrated circuit device, determining, based upon data obtained from said at least one electrical performance test, a target thickness for at least one inter-level dielectric layer to be formed above a wafer, and performing a deposition process to form said at least one inter-level dielectric layer to said target thickness. In other embodiments, the method comprises determining a duration of a deposition process to be performed to form the at least one inter-level dielectric layer, and performing the deposition process for the determined duration. In another aspect, the present invention is directed to a system that comprises an electrical metrology tool adapted to perform at least one electrical test on an integrated circuit device, a controller that determines, based upon data obtained from said at least one electrical performance test, a target thickness for at least one inter-level dielectric layer to be formed above a wafer, and a deposition tool for performing a deposition process to form the inter-level dielectric layer to the target thickness.

96 Claims, 3 Drawing Sheets (Prior Art)

METHOD OF CONTROLLING THE DEPOSITION OF INTER-LEVEL DIELECTRIC LAYERS BASED UPON ELECTRICAL PERFORMANCE TESTS, AND SYSTEM FOR ACCOMPLISHING SAME

BACKGROUND OF THE INVENTION

1. Field of the Invention

This invention relates generally to semiconductor fabrication technology, and, more particularly, to a method of controlling the deposition of inter-level dielectric layers based upon electrical performance tests, and system for accomplishing same.

2. Description of the Related Art

There is a constant drive to reduce the size, or scale, of transistors to increase the overall speed of the transistor, as well as integrated circuit devices incorporating such transistors. A conventional integrated circuit device, such as a microprocessor, is typically comprised of millions of transistors formed above the surface of a semiconducting substrate. For the integrated circuit device to function, the transistors must be electrically connected to one another through a plurality of conductive interconnections, i.e., conductive lines and plugs.

Many modern integrated circuit devices are very densely packed, i.e., there is very little space between the transistors formed above the substrate. Thus, these conductive interconnections must be made in multiple layers to conserve plot space on the semiconducting substrate. This is typically accomplished through the formation of alternating layers of conductive lines and conductive plugs formed in a plurality of inter-level dielectric layers formed on the device. The inter-level dielectric layer may be comprised of a variety of insulating materials, e.g., silicon dioxide, silicon oxynitride, etc. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

Figure 1:
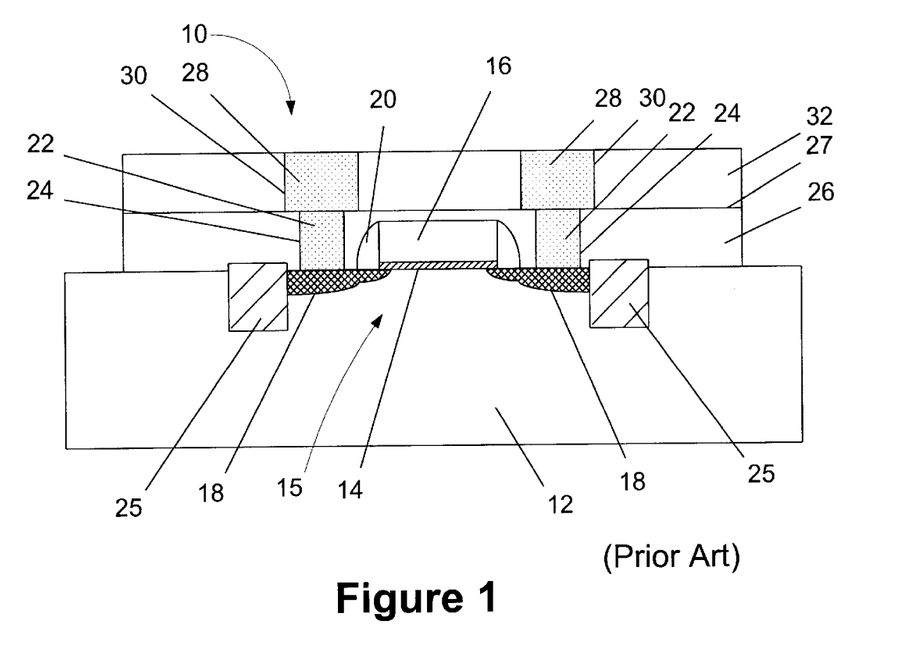
FIG. 1 is a cross-sectional view of an illustrative prior art transistor.

By way of background, an illustrative transistor 10 that may be included in such an integrated circuit device is shown in FIG. 1. The transistor 10 is generally comprised of a gate insulation layer 14, a gate electrode 16, sidewall spacers 20 and a plurality of source/drain regions 18 formed in an active area 15 of a semiconducting wafer 12 between isolation regions 25. The gate insulation layer 14 may be formed from a variety of materials, such as silicon dioxide. The gate electrode 16 may also be formed from a variety of materials, such as polysilicon. The source and drain regions 18 may be formed by performing one or more ion implantation processes during which a dopant material is implanted into the wafer 12.

In one illustrative process flow, a first inter-level dielectric layer 26 is formed above the transistor 10, and a plurality of openings 24 are formed in the first inter-level dielectric layer 26. Thereafter, the openings 24 are filled with a conductive material, such as a metal, to form conductive plugs 22. In the illustrative transistor 10 shown in FIG. 1, the conductive plugs 22 are electrically coupled to the source and drain regions 18 of the transistor 10. Within the semiconductor industry, the conductive plugs 22 may be referred to as either contacts or vias. In general, conductive plugs that are coupled to regions of a transistor, e.g., source/drain regions, are referred to as contacts. Conductive plugs that serve other functions, such as connecting two different layers of conductive lines, are known as vias. However, different terminology may be employed within the industry to distinguish conductive plugs on this basis. Thus, as used herein, the term conductive plugs should be understood to include both contacts and vias.

Thereafter, a second inter-level dielectric layer 32 may be formed above the first inter-level dielectric layer 26. Multiple openings 30 may be formed in the second inter-level dielectric layer 32, and the openings 30 may thereafter be filled with a conductive material to form conductive lines 28. Although only a single level of conductive plugs and a single level of conductive lines are depicted in FIG. 1, there may be multiple levels of plugs and lines interleaved with one another. This interconnected network of plugs and lines allows electrical signals to propagate throughout the integrated circuit device. The techniques used for forming the various components depicted in FIG. 1 are known to those skilled in the art and will not be repeated here in any detail.

The conductive plugs 22 and conductive lines 28 may be of any size or configuration, they may be formed by any of a variety of techniques, and they may be comprised of any of a variety of conductive materials. For example, the conductive plugs 22 depicted in FIG. 1 may have a circular cross-section, i.e., the plug may be essentially a cylinder of material. However, the plug 22 can be made into any of a variety of shapes, e.g., square, rectangular, etc. Further, the inter-level dielectric layers 26, 32 may be comprised of any insulating material, such as silicon dioxide or a low-k dielectric, and there may be many such inter-level dielectric layers on a completed integrated circuit device. Typically, the inter-level dielectric layer 26 is formed by depositing the layer 26, and thereafter, subjecting it to a planarization operation, such as a chemical mechanical polishing ("CMP") operation, so as to produce an essentially planar surface 27. Next, the plurality of openings 24 are formed in the inter-level dielectric layer 26 by performing known photolithography and etching processes, e.g., an anisotropic plasma etching process.

Thereafter, a layer (not shown) of the appropriate conductive material, e.g., a metal, may be blanket-deposited, or otherwise formed, over the transistor 10, thereby filling the openings 24 formed in the first inter-level dielectric layer 26. The metal layer (not shown) may thereafter be subjected to a CMP process to remove the excess material, thereby leaving the conductive plugs 22 in the openings 24. A barrier metal layer (not shown) may be formed in the opening prior to the metal deposition process but such details are omitted for purposes of clarity.

Next, the inter-level dielectric layer 32 is formed above the inter-level dielectric layer 26, and the plurality of openings 30 may be defined in the inter-level dielectric layer 32 through use of traditional photolithography and etching processes. Thereafter, the conductive line 28 is formed in the opening 30 in the inter-level dielectric layer 32. As with the plug 22, the conductive line 28 may be formed in any of a variety of shapes, using any of a variety of known techniques for forming such lines, and may be comprised of a variety of materials. For example, the conductive line 28 may be comprised of tungsten, aluminum etc. That is, the conductive lines 28 may be formed by depositing a layer of the appropriate conductive material in the openings 30, and, thereafter, performing a chemical mechanical polishing process.

As stated previously, there is a constant drive to increase the operating speed of integrated circuit devices. However, one factor that may tend to decrease the operating speed of the completed device is the capacitive coupling between the various conductive interconnection, i.e., lines and plugs, of the device when it is operational. This capacitive coupling is undesirable in that it must be charged and discharged on every operational cycle, thereby reducing the switching speed of the transistor. Moreover, such capacitive coupling tends to increase the power consumption of the completed device.

In general, the capacitive coupling of adjacent structures, e.g., lines and plugs, is inversely proportional to the distance ("d") between the structures and directly proportional to the dielectric constant ("k") of the material positioned between the structures. Unfortunately, as the packing densities of modern integrated circuit devices continues to increase, the spacing, both horizontal and vertical, between conductive lines and plugs continues to decrease, thereby tending to increase the undesired capacitive coupling between the conductive lines and plugs.

Thus, one factor that may adversely affect the capacitive coupling of the integrated circuit device is the thickness of the inter-level dielectric layers, e.g., layers 26, 32. That is, if, for example, one or more of the inter-level dielectric layers 26, 32 are made thinner than anticipated, the conductive interconnections, i.e., lines and/or plugs, may be closer together. As a result, the capacitive coupling of the conductive interconnections during operations may be increased relative to what was anticipated by the design process. In some situations, this may render the resulting integrated circuit device unusable, or at least less desirable, from a performance perspective.

The present invention is directed to a method and system that may solve, or at least reduce, some or all of the aforementioned problems.

SUMMARY OF THE INVENTION

In general, the present invention is directed a method of controlling the deposition of inter-level dielectric layers based upon electrical performance tests, and system for accomplishing same. In one illustrative embodiment, the method comprises performing at least one electrical performance test on at least one integrated circuit device, determining, based upon data obtained from said at least one electrical performance test, a target thickness for at least one inter-level dielectric layer to be formed above a wafer, and performing a deposition process to form the inter-level dielectric layer to the target thickness. In other embodiments, the method involves determining a duration of a deposition process to be performed to form an inter-level dielectric layer above a wafer, and performing the deposition process for the determined duration to form the inter-level dielectric layer above the wafer.

In another aspect, the present invention is directed to a system that comprises an electrical metrology tool adapted to perform at least one electrical test on at least one integrated circuit device, a controller that determines, based upon data obtained from the at least one electrical performance test, a target thickness of at least one inter-level dielectric layer to be formed above a wafer, and a deposition tool for performing a deposition process to form the at least one inter-level dielectric layer to the target thickness.

In another aspect, the present invention is directed to a system that comprises an electrical metrology tool adapted to perform at least one electrical test on an integrated circuit device, a controller that determines, based upon data obtained from said at least one electrical performance test, a duration of a deposition process to be performed to form an inter-level dielectric layer comprised of an insulating material, and a deposition tool for performing said deposition process for said determined duration.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, the various components depicted in the illustrative system of the present invention do not depict all of the supporting utilities, devices and structures of such components for purposes of clarity. Nevertheless, the attached drawings are included to describe and explain illustrative examples of the present invention.

In general, the present invention is directed to a method of controlling the deposition of inter-level dielectric layers based upon electrical performance tests, and a system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

The present invention may be performed in the context of forming one or more inter-level dielectric layers comprised of a variety of different insulating materials, e.g., silicon dioxide, silicon oxynitride, HSQ, or a material having a dielectric constant less than 5.0. The inter-level dielectric layers formed in accordance with the present invention are adapted to have a plurality of conductive interconnections, e.g., conductive lines and/or conductive plugs, formed therein. The conductive interconnections may be comprised of a variety of materials, e.g., aluminum, copper, etc. Moreover, the present invention may be employed to form the inter-level dielectric layer to any desired thickness. Lastly, the present invention may be employed to form a layer of insulating material at any level of a multi-level structure commonly found in modern integrated circuit devices.

Figure 2:
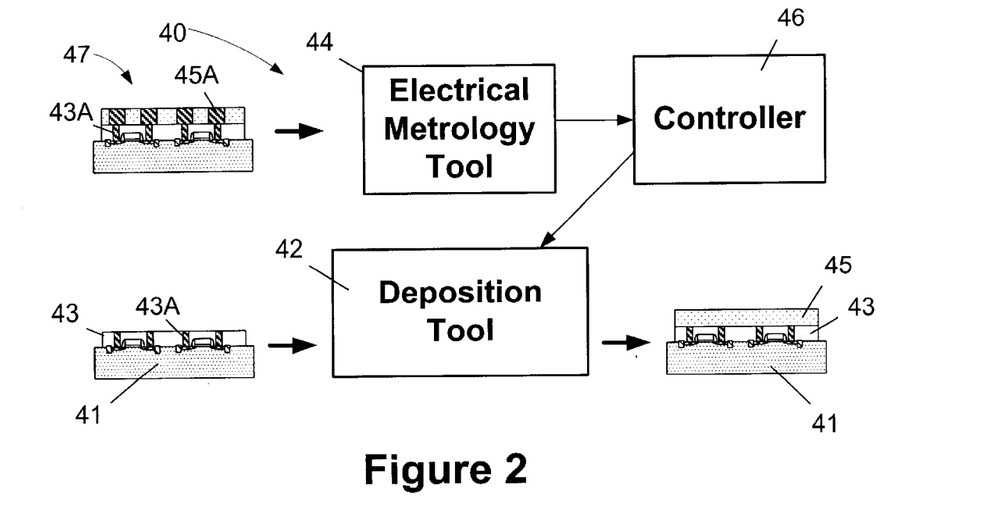
FIG. 2 depicts an illustrative embodiment of a system in accordance with one embodiment of the present invention.

FIG. 2 depicts an embodiment of a system 40 in accordance with one illustrative embodiment of the present invention. As shown therein, the system 40 is comprised of a deposition tool 42, an electrical metrology tool 44, and a controller 46. Also depicted in FIG. 2, to the left of the deposition tool 42, is a wafer 41 that is at the point in processing where an inter-level dielectric layer 45 will be formed above the wafer 41 in the deposition tool 42. The inter-level dielectric layer 45 is depicted on the wafer 41 to the right of the deposition tool 42. In the depicted embodiment in FIG. 2, the inter-level dielectric layer 45 is formed above a previously formed inter-level dielectric layer 43 having a plurality of conductive interconnections, e.g., conductive plugs 43A formed therein.

The deposition tool 42 is intended to be representative of any type of processing tool whereby the inter-level dielectric layer 45 may be formed. For example, the deposition tool 42 may be a process tool capable of performing a chemical vapor deposition (CVD) process, a plasma enhanced chemical vapor deposition (PECVD) process, or other processes that may be performed to form the inter-level dielectric layer 45. The deposition tool 42 may be a stand-alone tool or it may be part of a cluster of processing tools. In one illustrative embodiment, the deposition tool 42 is a Sequel CVD deposition tool system manufactured by Novellus.

The electrical metrology tool 44 may be any type of metrology tool useful for performing the desired electrical performance test on the conductive interconnections formed on an integrated circuit device 47 depicted in FIG. 2, e.g., conductive lines 45A, conductive plugs 43A, etc. Of course, in referring to the device 47 as being complete, it should be understood that that term is used in the sense that the device is at the point in processing where it is desirable to perform one or more electrical performance tests on the device. Moreover, such electrical performance test may be performed at any time during the manufacture of the integrated circuit device, i.e., before or after the wafer 41 is cut into individual die, after only some of the inter-level dielectric layers are formed, etc.

As stated previously, the electrical metrology tool 44 may be used to perform one or more electrical performance tests on a completed or partially completed integrated circuit device. That is, such testing may be performed at any level of a device comprised of multiple inter-level dielectric layers. For example, some modern integrated circuit devices have five inter-level dielectric layers with conductive interconnections formed therein. The electrical performance testing described herein may be performed at any level of such a multi-level structure. The nature of the testing performed may vary depending upon the devices under construction and the judgment of the responsible process engineer. For example, the electrical metrology tool 44 may be an electrical measurement tool adapted to test the capacitance of a completed or partially completed integrated circuit device one or more times during the course of its manufacture. In one illustrative embodiment, a 47OI CV plotter tool manufactured by SSM may be used to test the capacitance of the device. This tool calculates capacitance by measuring the accumulated storage charge on the dielectric after a voltage has been applied. Of course, other wafer electrical test ("WET") tools may also be employed in performing various electrical tests.

In the illustrated embodiment, the controller 46 is a computer programmed with software to implement the functions described herein. Moreover, the functions described for the controller 46 may be performed by one or more controllers spread through the system. For example, the controller 46 may be a fab level controller that is used to control processing operations throughout all or a portion of a semiconductor manufacturing facility. Alternatively, the controller 46 may be a lower level computer that controls only portions or cells of the manufacturing facility. Moreover, the controller 46 may be a stand-alone device, or it may reside on the deposition tool 42 or the electrical metrology tool 44. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 46, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699 - Provisional Specification for CIM Framework Domain Architecture) and APC (SEMI E93-0999 - Provisional Specification for CIM Framework Advanced Process Control Component) specifications are publicly available from SEMI.

The operation of the system 40, as well as several inventive methods of the present application, will now be described. In operation, the electrical metrology tool 44 will be used to obtain various electrical test data resulting from various electrical performance tests that are performed on one or more complete, or partially complete, integrated circuit devices 47, one of which is illustratively depicted in FIG. 2. The device 47 has a plurality of conductive interconnections formed in the inter-level dielectric layers. The electrical test data obtained by the electrical metrology tool 44 may be averaged or otherwise statistically manipulated, as determined by the responsible process engineer, to determine a representative value or values for the devices tested. The electrical testing described herein will typically be performed on various test structures formed in the scribe lines or in other unused areas of the wafer. However, if desired, such testing may be performed on production integrated circuit devices being formed on the wafer.

Typically, in manufacturing, efforts are made to form the inter-level dielectric layers on an integrated circuit device to a target or design thickness. The target thickness for all of the layers may be different or some or all of them may have different target thicknesses. Of course, due to a variety of reasons, e.g., manufacturing tolerances and variations, the actually formed layers may have a thickness that varies somewhat from the target thickness. Thus, when statements to the effect of forming an inter-level dielectric layer to its target thickness are used herein, it should be understood that that is the intended thickness, not the thickness of the inter-level dielectric as actually formed, as that thickness may vary due to manufacturing tolerances, etc.

According to one aspect of the present invention, the electrical test data obtained by the electrical metrology tool 44 may be provided to the controller 46. In turn, the controller 46 determines, based upon the electrical performance test data, a new target thickness, or an adjustment to an original target thickness of one or more of the inter-level dielectric layers. The present invention may be employed in either a feed back or feed forward situation. For example, if the device is tested after one or more or all of the inter-level dielectric layers are formed, the test data may indicate that the overall capacitance of the device is too high relative to some preselected allowable limit. As a result, the controller 46 may increase the target thickness for one or more of the inter-level dielectric layers to be formed on subsequently processed wafers in an attempt to reduce the overall capacitance of the device. The incremental amount by which the target thickness may be adjusted will vary depending upon the device under construction. For example, the target thickness of one or more of the inter-level dielectric layers may be adjusted in increments of approximately 100 Å. These adjustments may be made until such time as the electrical test data indicates that the capacitance of the subsequently analyzed devices is within acceptable limits.

In other embodiments, the electrical test data may be used in a feed forward type fashion, for example, if a device is at a point in fabrication where at least some, but not all, of the inter-level dielectric layers have been formed. In this situation, the electrical test data may indicate that the capacitance of the device is too high. As a result, the controller 46 may increase the target thickness for one or more of the inter-level dielectric layers to be formed on the tested devices, or on additional devices that are assumed to be represented by the tested devices. Thereafter, the deposition tool 42 forms the subsequent inter-level dielectric layers to the new target thickness value.

In other embodiments, where the controller 46 is provided with information as to the actual or anticipated deposition rate of the deposition tool 42, the controller 46 may determine, based upon the electrical performance tests, the duration of the deposition process to be performed in the deposition tool 42. In this manner, the controller 46 may directly control the duration of the deposition process performed in each unique deposition tool 42.

In further embodiments, a model may be constructed that correlates the test data obtained from the electrical metrology tool 44 with a target thickness for an inter-level dielectric layer. In other embodiments, a model may be constructed that correlates test data obtained by the electrical metrology tool 44 with a duration of a deposition process to be performed on the deposition tool 42. These models may be stored anywhere in the system 40. Moreover, these models may take any form, e.g., they may be in the form of a look-up table. In operation, once the controller 46 receives data from the electrical performance test, it may access one or more of the models to determine the desired parameter, i.e., target thickness of the inter-level dielectric layer to be performed in a particular deposition tool.

Figure 3:
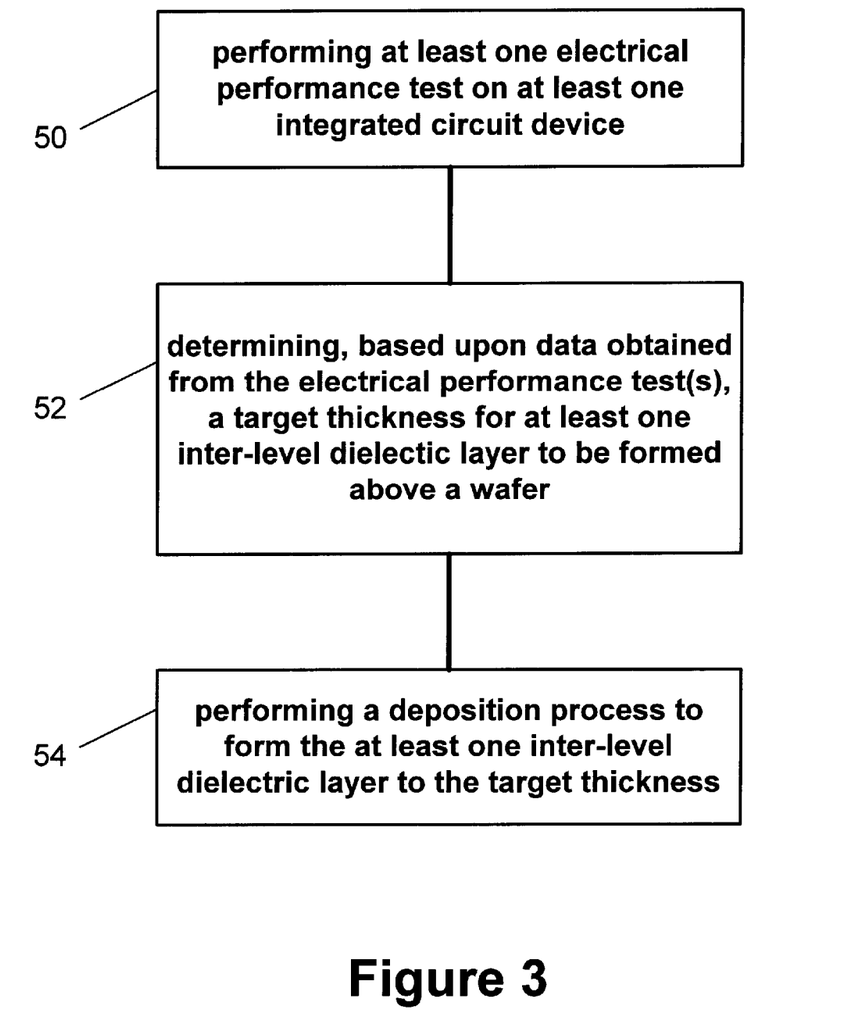
FIG. 3 is a flowchart depicting one illustrative embodiment of the present invention in flowchart form.

One illustrative embodiment of the present invention is depicted in flowchart form in FIG. 3. As shown therein, the method comprises performing at least one electrical performance test on at least one integrated circuit device, as set forth at block 50, determining, based upon data obtained from the at least one electrical performance test, a target thickness of at least one inter-level dielectric layer to be formed above a wafer, as recited at block 52, and performing a deposition process to form the at least one inter-level dielectric layer to the target thickness, as set forth at block 54.

Figure 4:
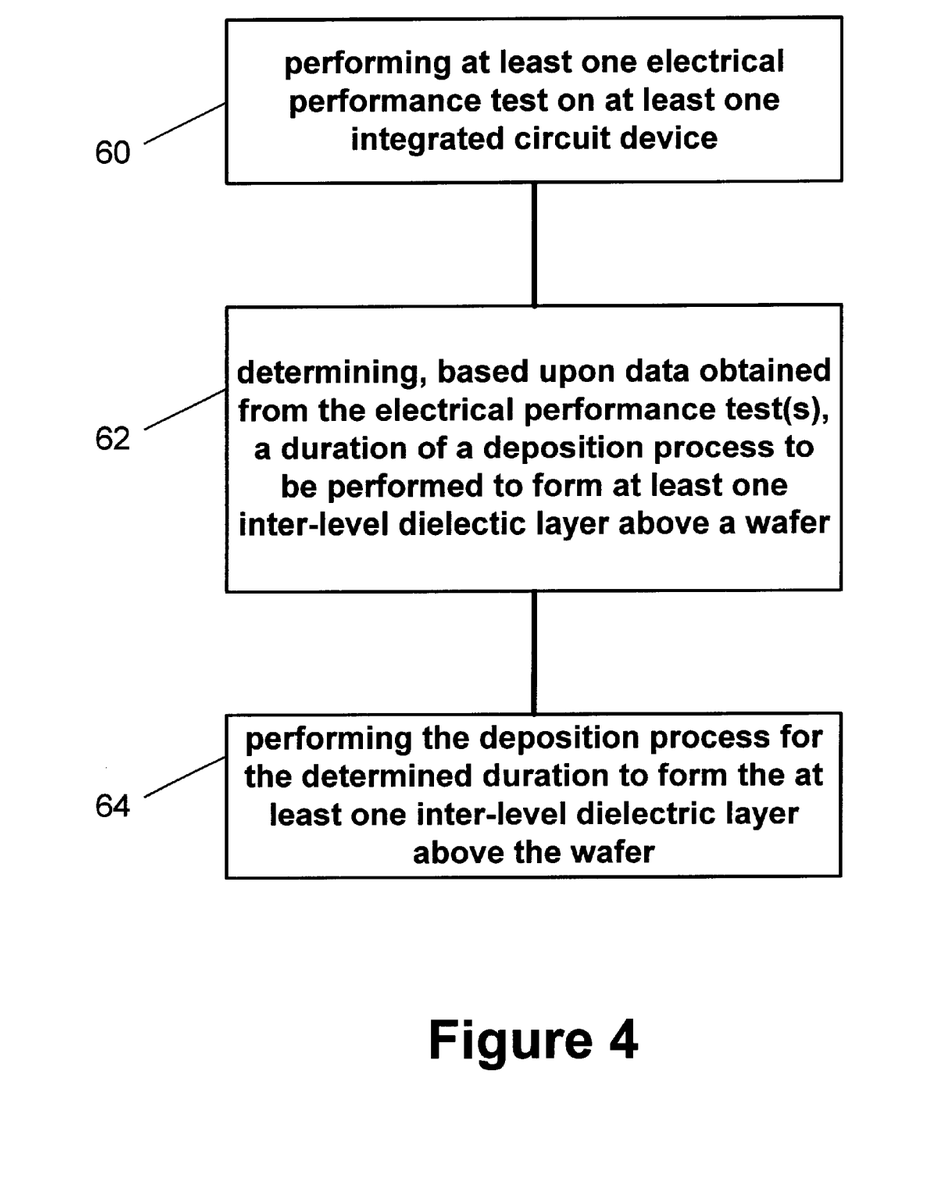
FIG. 4 is a flowchart depicting another illustrative embodiment of the present invention in flowchart form.

Another illustrative embodiment of the present invention is depicted in flowchart form in FIG. 4. As described therein, the method comprises performing at least one electrical performance test on an integrated circuit device, as set forth at block 60, determining, based upon data obtained from said at least one electrical performance test, a duration of a deposition process to be performed to form at least one inter-level dielectric layer above a wafer, as recited at block 62, and performing the deposition process for the determined duration to form the at least one inter-level dielectric layer above the wafer, as set forth at block 64.

As set forth above, the present invention may also be employed in situations where multiple dielectric layers having conductive connections formed therein are formed above a wafer and subjected to certain metrology tests, e.g., a capacitance test. Thereafter, based upon data obtained from such test, the target thickness of one or more, or even all, of the layers comprising the multiple inter-level dielectric layers that are to be formed above a subsequently processed wafer may be determined or adjusted. That is, based upon the electrical test data, a new or adjusted target thickness is adjusted for one or more of the inter-level dielectric layers to be formed on subsequent wafers. In one particularly illustrative embodiment, such a method comprises performing at least one electrical performance test on at least one integrated circuit device comprised of a plurality of inter-level dielectric layers, each having a plurality of conductive interconnections formed therein, determining, based upon data obtained from the at least one electrical performance test, a target thickness of at least one inter-level dielectric layer to be formed above a subsequently processed wafer, and performing a deposition process to form the at least one inter-level dielectric layer to the target thickness above the wafer. In further embodiments, the target thickness of each of a plurality of inter-level dielectric layers to be formed above a subsequently processed wafer is determined based upon the data obtained from the electrical performance test. A corresponding method involves determining the duration of a deposition process based upon the electrical test of an integrated circuit device comprised of multiple layers. The present invention is also directed to systems for performing such methods.

In another aspect, the present invention is directed to a system that comprises an electrical metrology tool adapted to perform at least one electrical test on at least one integrated circuit device, a controller that determines, based upon data obtained from the at least one electrical performance test, a target thickness of at least one inter-level dielectric layer to be formed above a wafer, and a deposition tool for performing a deposition process to form the at least one inter-level dielectric layer to the target thickness.

In another aspect, the present invention is directed to a system that comprises an electrical metrology tool adapted to perform at least one electrical test on an integrated circuit device, a controller that determines, based upon data obtained from said at least one electrical performance test, a duration of a deposition process to be performed to form an inter-level dielectric layer comprised of an insulating material, and a deposition tool for performing said deposition process for said determined duration.

In another aspect, the present invention is directed to a system that comprises means for performing at least one electrical test on at least one integrated circuit device, a controller means for determining, based upon data obtained from said at least one electrical performance test, a target thickness of at least one inter-level dielectric layer to be formed above a wafer, and means for performing said deposition process to form said at least one inter-level dielectric layer to said target thickness.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing at least one electrical performance test on at least one integrated circuit device;
    determining, based upon data obtained from said at least one electrical performance test, a target thickness of at least one inter-level dielectric layer to be formed above a wafer; and
    performing a deposition process to form said at least one inter-level dielectric layer to said target thickness above said wafer.

2. The method of claim 1, wherein performing at least one electrical performance test on an integrated circuit device comprises performing at least one capacitance test on said integrated circuit device.

3. The method of claim 1, wherein performing a deposition process to form said at least one inter-level dielectric layer comprises performing at least one of a chemical vapor deposition process and a plasma enhanced chemical vapor deposition process to form said at least one inter-level dielectric layer.

4. The method of claim 1, wherein performing a deposition process to form said at least one inter-level dielectric layer comprises performing a deposition process to form said at least one inter-level dielectric layer comprised of at least one of silicon dioxide, silicon oxynitride, silicon nitride, and a material having a dielectric constant less than 5.0.

5. The method of claim 1, further comprising determining, based upon said at least one electrical performance test, a duration of said deposition process.

6. The method of claim 5, further comprising performing said deposition process for said determined duration.

7. The method of claim 1, further comprising forming a plurality of conductive interconnections in said inter-level dielectric layer.

8. The method of claim 1, further comprising constructing a model that correlates data obtained from said at least one electrical performance test with a target thickness for said at least one inter-level dielectric layer.

9. The method of claim 8, further comprising determining a target thickness for said inter-level dielectric layer by accessing said model.

10. The method of claim 1, further comprising constructing a model that correlates data obtained from said at least one electrical performance test with a duration of said deposition process to be performed to form said inter-level dielectric layer.

11. The method of claim 10, further comprising determining a duration of said deposition process is performed by accessing said model.

12. A method, comprising:
    performing at least one electrical performance test on an integrated circuit device;
    determining, based upon data obtained from said at least one electrical performance test, a target thickness of at least one inter-level dielectric layer to be formed above a wafer by accessing a model that correlates data obtained from said at least one electrical performance test with a target thickness for said at least one inter-level dielectric layer; and
    performing a deposition process to form said at least one inter-level dielectric layer to said target thickness above said wafer.

13. The method of claim 12, wherein performing at least one electrical performance test on an integrated circuit device comprises performing at least one capacitance test on said integrated circuit device.

14. The method of claim 12, wherein performing a deposition process to form said at least one inter-level dielectric layer comprises performing at least one of a chemical vapor deposition process and a plasma enhanced chemical vapor deposition process to form said at least one inter-level dielectric layer.

15. The method of claim 12, wherein performing a deposition process to form said at least one inter-level dielectric layer comprises performing a deposition process to form said at least one inter-level dielectric layer comprised of at least one of silicon dioxide, silicon oxynitride, silicon nitride, and a material having a dielectric constant less than 5.0.

16. The method of claim 12, further comprising determining, based upon said at least one electrical performance test, a duration of said deposition process.

17. The method of claim 16, further comprising performing said deposition process for said determined duration.

18. The method of claim 12, further comprising forming a plurality of conductive interconnections in said inter-level dielectric layer.

19. The method of claim 12, further comprising constructing a model that correlates data obtained from said at least one electrical performance test with a duration of said deposition process to be performed to form said inter-level dielectric layer.

20. The method of claim 19, further comprising determining a duration of said deposition process is performed by accessing said model.

21. A method, comprising:
performing at least one electrical performance test on at least one integrated circuit device comprised of a plurality of inter-level dielectric layers, each having a plurality of conductive interconnections formed therein;
determining, based upon data obtained from said at least one electrical performance test, a target thickness of at least one inter-level dielectric layer to be formed above a subsequently processed wafer; and
performing a deposition process to form said at least one inter-level dielectric layer to said target thickness above said wafer.

22. The method of claim 21, wherein performing at least one electrical performance test on at least one integrated circuit device comprises performing at least one capacitance test on said at least one integrated circuit device.

23. The method of claim 21, wherein performing a deposition process to form said at least one inter-level dielectric layer comprises performing at least one of a chemical vapor deposition process and a plasma enhanced chemical vapor deposition process to form said at least one inter-level dielectric layer.

24. The method of claim 21, wherein performing a deposition process to form said at least one inter-level dielectric layer comprises performing a deposition process to form said at least one inter-level dielectric layer comprised of at least one of silicon dioxide, silicon oxynitride, silicon nitride, and a material having a dielectric constant less than 5.0.

25. The method of claim 21, wherein determining, based upon data obtained from said at least one electrical performance test, a target thickness of at least one inter-level dielectric layer to be formed above a subsequently processed wafer comprises determining, based upon data obtained from said at least one electrical performance test, a target thickness of each of a plurality of inter-level dielectric layers to be formed above a subsequently processed wafer.

26. The method of claim 25, further comprising performing at least one deposition process to form each of said plurality of inter-level dielectric layers to said target thickness.

27. The method of claim 21, further comprising determining, based upon said at least one electrical performance test, a duration of said deposition process.

28. The method of claim 27, further comprising performing said deposition process for said determined duration.

29. The method of claim 21, further comprising forming a plurality of conductive interconnections in said inter-level dielectric layer.

30. The method of claim 21, further comprising constructing a model that correlates data obtained from said at least one electrical performance test with a target thickness for said at least one inter-level dielectric layer.

31. The method of claim 30, further comprising determining a target thickness for said inter-level dielectric layer by accessing said model.

32. The method of claim 21, further comprising constructing a model that correlates data obtained from said at least one electrical performance test with a duration of said deposition process to be performed to form said inter-level dielectric layer.

33. The method of claim 32, further comprising determining a duration of said deposition process is performed by accessing said model.

34. A method, comprising:
performing at least one electrical performance test on at least one integrated circuit device;
determining, based upon data obtained from said at least one electrical performance test, a duration of a deposition process to be performed to form at least one inter-level dielectric layer above a wafer; and
performing said deposition process for said determined duration to form said at least one inter-level dielectric layer above said wafer.

35. The method of claim 34, wherein performing at least one electrical performance test on an integrated circuit device comprises performing at least one capacitance test on said integrated circuit device.

36. The method of claim 34, wherein performing a deposition process to form said at least one inter-level dielectric layer comprises performing at least one of a chemical vapor deposition process and a plasma enhanced chemical vapor deposition process to form said at least one inter-level dielectric layer.

37. The method of claim 34, wherein performing a deposition process to form said at least one inter-level dielectric layer comprises performing a deposition process to form said at least one inter-level dielectric layer comprised of at least one of silicon dioxide, silicon oxynitride, silicon nitride, and a material having a dielectric constant less than 5.0 above said wafer.

38. The method of claim 34, further comprising determining, based upon said at least one electrical performance test, a target thickness for said at least one inter-level dielectric layer.

39. The method of claim 38, further comprising performing said deposition process to form said at least one inter-level dielectric layer to said target thickness.

40. The method of claim 34, further comprising forming a plurality of conductive interconnections in said at least one inter-level dielectric layer.

41. The method of claim 34, further comprising constructing a model that correlates data obtained from said at least one electrical performance test with a duration of said deposition process to be performed to form said at least one inter-level dielectric layer.

42. The method of claim 41, wherein said step of determining a duration of said deposition process is performed by accessing said model.

43. The method of claim 34, further comprising constructing a model that correlates data obtained from said at least one electrical performance test with a target thickness for said at least one inter-level dielectric layer.

44. The method of claim 43, further comprising determining a target thickness for said at least one inter-level dielectric layer by accessing said model.

45. A method, comprising:
performing at least one electrical performance test on at least one integrated circuit device;

determining, based upon data obtained from said at least one electrical performance test, a duration of a deposition process to be performed to form at least one inter-level dielectric layer above a wafer by accessing a model that correlates data obtained from said at least one electrical performance test with a duration of said deposition process to be performed to form said at least one inter-level dielectric layer; and performing said deposition process for said determined duration to form said at least one inter-level dielectric layer above said wafer.

46. The method of claim 45, wherein performing at least one electrical performance test on an integrated circuit device comprises performing at least one capacitance test on said integrated circuit device.

47. The method of claim 45, wherein performing a deposition process to form said at least one inter-level dielectric layer comprises performing at least one of a chemical vapor deposition process and a plasma enhanced chemical vapor deposition process to form said at least one inter-level dielectric layer.

48. The method of claim 45, wherein performing a deposition process to form said at least one inter-level dielectric layer comprises performing a deposition process to form said at least one inter-level dielectric layer comprised of at least one of silicon dioxide, silicon oxynitride, silicon nitride, and a material having a dielectric constant less than 5.0 above said wafer.

49. The method of claim 45, further comprising determining, based upon said at least one electrical performance test, a target thickness for said at least one inter-level dielectric layer.

50. The method of claim 49, further comprising performing said deposition process to form said at least one inter-level dielectric layer to said target thickness.

51. The method of claim 45, further comprising forming a plurality of conductive interconnections in said at least one inter-level dielectric layer.

52. The method of claim 45, further comprising constructing a model that correlates data obtained from said at least one electrical performance test with a target thickness for said at least one inter-level dielectric layer.

53. The method of claim 45, further comprising determining a target thickness for said at least one inter-level dielectric layer by accessing said model.

54. A method, comprising:

performing at least one electrical performance test on at least one integrated circuit device comprised of a plurality of inter-level dielectric layers, each having a plurality of conductive interconnections formed therein;

determining, based upon data obtained from said at least one electrical performance test, a duration of a deposition process to be performed to form at least one inter-level dielectric layer above a subsequently processed wafer; and performing said deposition process for said determined duration to form said at least one inter-level dielectric layer above said wafer.

55. The method of claim 54, wherein performing at least one electrical performance test on at least one integrated circuit device comprises performing at least one capacitance test on said at least one integrated circuit device.

56. The method of claim 54, wherein performing a deposition process to form said at least one inter-level dielectric layer comprises performing at least one of a chemical vapor deposition process and a plasma enhanced chemical vapor deposition process to form said at least one inter-level dielectric layer.

57. The method of claim 54, wherein performing a deposition process to form said at least one inter-level dielectric layer comprises performing a deposition process to form said at least one inter-level dielectric layer comprised of at least one of silicon dioxide, silicon oxynitride, silicon nitride, and a material having a dielectric constant less than 5.0 above said wafer.

58. The method of claim 54, wherein determining, based upon data obtained from said at least one electrical performance test, a duration of a deposition process to be performed to form at least one inter-level dielectric layer above a subsequently processed wafer comprises determining, based upon data obtained from said at least one electrical performance test, a duration of a deposition process to be performed to form each of a plurality of inter-level dielectric layers above a subsequently processed wafer.

59. The method of claim 58, further comprising performing at least one deposition process for said determined duration to form each of said plurality of inter-level dielectric layers.

60. The method of claim 54, further comprising determining, based upon said at least one electrical performance test, a target thickness for said at least one inter-level dielectric layer.

61. The method of claim 60, further comprising performing said deposition process to form said at least one inter-level dielectric layer to said target thickness.

62. The method of claim 54, further comprising forming a plurality of conductive interconnections in said at least one inter-level dielectric layer.

63. The method of claim 54, further comprising constructing a model that correlates data obtained from said at least one electrical performance test with a duration of said deposition process to be performed to form said at least one inter-level dielectric layer.

64. The method of claim 63, wherein said step of determining a duration of said deposition process is performed by accessing said model.

65. The method of claim 54, further comprising constructing a model that correlates data obtained from said at least one electrical performance test with a target thickness for said at least one inter-level dielectric layer.

66. The method of claim 54, further comprising determining a target thickness for said at least one inter-level dielectric layer by accessing said model.

67. A system, comprising:

an electrical metrology tool adapted to perform at least one electrical test on at least one integrated circuit device;

a controller that determines, based upon data obtained from said at least one electrical performance test, a target thickness of at least one inter-level dielectric layer to be formed above a wafer; and a deposition tool for performing a deposition process to form said at least one inter-level dielectric layer to said target thickness.

68. The system of claim 67, wherein said electrical metrology tool is a capacitance-voltage plotter tool.

69. The system of claim 67, wherein said electrical metrology tool is adapted to perform at least one capacitance test on said at least one integrated circuit device.

70. The system of claim 67, wherein said controller is a stand-alone device.

71. The system of claim 67, wherein said controller is resident on at least one of said electrical metrology tool and said deposition tool.

72. The system of claim 67, wherein said deposition tool is adapted to perform at least one of a chemical vapor deposition process and a plasma enhanced chemical vapor deposition process.

73. The system of claim 67, wherein said deposition tool is adapted to form said at least one inter-level dielectric layer that is comprised of at least one of silicon dioxide, silicon oxynitride, silicon nitride, and a material having a dielectric constant less than 5.0.

74. The system of claim 67, wherein said controller determines said target thickness by calculating said target thickness based upon data obtained from said at least one electrical performance test.

75. The system of claim 67, wherein said controller determines said target thickness by accessing a model that correlates data obtained from said at least one performance test with a target thickness for said at least one inter-level dielectric layer.

76. A system, comprising:
 an electrical metrology tool adapted to perform at least one electrical test on an integrated circuit device;
 a controller that determines, based upon data obtained from said at least one electrical performance test, a duration of a deposition process to be performed to form at least one inter-level dielectric layer; and
 a deposition tool for performing said deposition process for said determined duration.

77. The system of claim 76, wherein said electrical metrology tool is a capacitance-voltage plotter tool.

78. The system of claim 76, wherein said electrical metrology tool is adapted to perform at least one capacitance test on said at least one integrated circuit device.

79. The system of claim 76, wherein said controller is a stand-alone device.

80. The system of claim 76, wherein said controller is resident on at least one of said electrical metrology tool and said deposition tool.

81. The system of claim 76, wherein said deposition tool is adapted to perform at least one of a chemical vapor deposition process and a plasma enhanced chemical vapor deposition process.

82. The system of claim 76, wherein said deposition tool is adapted to form said inter-level dielectric layer comprised of at least one of silicon dioxide, silicon oxynitride, silicon nitride, and a material having a dielectric constant less than 5.0.

83. A system, comprising:
 means for performing at least one electrical test on at least one integrated circuit device;
 a controller means for determining, based upon data obtained from said at least one electrical performance test, a target thickness of at least one inter-level dielectric layer to be formed above a wafer; and
 means for performing said deposition process to form said at least one inter-level dielectric layer to said target thickness.

84. The system of claim 83, wherein said means for performing said at least one electrical performance test is a capacitance-voltage plotter tool.

85. The system of claim 83, wherein said means for performing said at least one electrical performance test is adapted to perform at least one capacitance test on said at least one integrated circuit device.

86. The system of claim 83, wherein said controller means is a stand-alone device.

87. The system of claim 83, wherein said controller means is resident on at least one of said means for performing at least one electrical test and said means for performing said deposition process.

88. The system of claim 83, wherein said means for performing a deposition process is adapted to perform at least one of a chemical vapor deposition process and a plasma enhanced chemical vapor deposition process.

89. The system of claim 83, wherein said means for performing a deposition process is adapted to form said at least one inter-level dielectric layer that is comprised of at least one of silicon dioxide, silicon oxynitride, silicon nitride, and a material having a dielectric constant less than 5.0.

90. A system, comprising:
 means for performing at least one electrical test on at least one integrated circuit device;
 a controller means for determining, based upon data obtained from said at least one electrical performance test, a duration of a deposition process to be performed to form at least one inter-level dielectric layer above a wafer; and
 means for performing said deposition process for said determined duration.

91. The system of claim 90, wherein said means for performing said at least one electrical test is a capacitance-voltage plotter tool.

92. The system of claim 90, wherein said means for performing said at least one electrical test is adapted to perform at least one capacitance test on said at least one integrated circuit device.

93. The system of claim 90, wherein said controller means is a stand-alone device.

94. The system of claim 90, wherein said controller means is resident on at least one of said means for performing at least one electrical test and said means for performing said deposition process.

95. The system of claim 90, wherein said means for performing said deposition process is adapted to perform at least one of a chemical vapor deposition process and a plasma enhanced chemical vapor deposition process.

96. The system of claim 90, wherein said means for performing said deposition process is adapted to form said at least one inter-level dielectric layer that is comprised of at least one of silicon dioxide, silicon oxynitride, silicon nitride, and a material having a dielectric constant less than 5.0.

\* \* \* \* \*